United States Patent [19]
Saiki et al.

[11] Patent Number: 5,715,037
[45] Date of Patent: Feb. 3, 1998

[54] SCANNING EXPOSURE APPARATUS

[75] Inventors: Kazuaki Saiki; Susumu Mori, both of Tokyo; Hiroshi Shirasu, Kanagawa-ken, all of Japan

[73] Assignee: Nikon Corporation, Tokyo, Japan

[21] Appl. No.: 615,853

[22] Filed: Mar. 12, 1996

[30] Foreign Application Priority Data

Mar. 14, 1995 [JP] Japan .................................. 7-054210

[51] Int. Cl.$^6$ ............................. H01L 21/27; G03F 7/20; G03F 9/00
[52] U.S. Cl. ........................... 355/53; 355/46; 356/401; 250/548
[58] Field of Search ......................... 356/399, 400, 356/401; 355/53, 50

[56] References Cited

U.S. PATENT DOCUMENTS 5,309,197  5/1994  Mori et al. ............................ 356/400
5,579,147  11/1996  Mori et al. ............................ 356/401

*Primary Examiner*—R. L. Moses
*Assistant Examiner*—Shival Virmani
*Attorney, Agent, or Firm*—Armstrong, Westerman, Hattori, McLeland & Naughton

[57] ABSTRACT

The present invention provides a scanning exposure apparatus for projecting an image of a pattern area of a mask having a first alignment mark onto a photosensitive substrate disposed on a substrate stage. A second alignment mark is provided on at least one of the photosensitive substrate and the substrate stage. The scanning exposure apparatus includes a plurality of projection optical systems disposed along a predetermined direction and adapted to receive the luminous fluxes passed through the mask and to project elected images of unchanged dimension of the plurality of illuminated regions of the mask onto the substrate. There is provided a mark detection system for detecting the first alignment mark on the mask and the second alignment mark, and at least one of the projection optical systems constitutes a part of the mark detection system.

17 Claims, 5 Drawing Sheets

SCANNING EXPOSURE APPARATUS

BACKGROUND OF THE INVENTION

1. Field of the Invention

The present invention relates to a scanning exposure apparatus, and more particularly, it relates to an exposure apparatus for projecting a mask pattern onto a large substrate so that the mask pattern is aligned with a previously formed substrate pattern to produce a large liquid crystal display panel and the like.

2. Related Background Art

In recent years, liquid crystal display substrates have widely been used as display elements for personal computers, television sets and the like. Such a liquid crystal display substrate is manufactured by forming transparent thin film electrodes on a photosensitive substrate (glass substrate) by a photolithography method. To carry out the photolithography method, projection exposure apparatuses for projecting an original image pattern formed on a mask onto a photoresist layer formed on a glass substrate through a projection optical system have been used.

Recently, it has been desired that the area of liquid crystal display substrate be increased, and, accordingly, it is desired to increase an exposure area in the projection exposure apparatus. In order to increase the exposure area, there has been proposed an exposure apparatus of so-called step-and-scan type (step-and-scan system exposure apparatus) in which, after the exposure is performed by scan-shifting of the mask and the photosensitive substrate with respect to the projection optical system, the mask and the photosensitive substrate are shifted by a predetermined distance in the direction perpendicular to the scanning direction and then another scanning-type exposure is achieved.

Generally, in the exposure apparatus of this kind, for a single photosensitive substrate (glass substrate), the projection of the original image pattern of a mask is repeated for several layers while effecting predetermined process treatments for the substrate. In this case, the exposure must be performed so that the patterns of these layers are brought to a predetermined alignment with each other. In order to achieve the alignment, it is necessary to position the mask and the photosensitive substrate on the basis of the results of detection of alignment marks provided on the mask and detection of reference marks disposed in a plane substantially flush with the main surface of the photosensitive substrate or alignment marks provided on the photosensitive substrate.

In the above-mentioned step-and-scan system exposure apparatus, even when it is intended to detect respective alignment marks through the projection optical system in order to position the mask and the photosensitive substrate, if the projection optical system is positioned at a central portion of the mask and the photosensitive substrate, the alignment marks of the mask and the photosensitive substrate cannot be detected simultaneously through the projection optical system, with the result that the mask and the photosensitive substrate cannot be positioned simultaneously. To avoid this, it is necessary that the alignment marks of the mask and the photosensitive substrate must be detected by respective detection systems separated from each other to position the mask and the photosensitive substrate. Consequently, not only the detection systems for detecting the alignment marks are partially duplicated to make the arrangement more complex, but also error becomes serious due to the difference in detecting time between the detection systems and accuracy for positioning (alignment) the patterns is worsened due to the difference in stability between the detection systems.

SUMMARY OF THE INVENTION

The present invention aims to eliminate the above-mentioned drawbacks, and an object of the present invention is to provide a scanning exposure apparatus having alignment mark detection systems which can greatly improve accuracy in alignment of patterns with a simple arrangement.

The present invention provides a scanning exposure apparatus for projecting an image of a pattern area of a mask having a first alignment mark onto a photosensitive substrate disposed on a substrate stage, wherein a second alignment mark is provided on at least one of the photosensitive substrate and the substrate stage.

To achieve the above object, according to the present invention, there is provided a scanning exposure apparatus comprising a plurality of illumination optical systems for directing luminous fluxes from light sources to a plurality of regions in a pattern area of a mask, respectively, a plurality of projection optical systems disposed along a predetermined direction and adapted to receive the luminous fluxes passed through the mask and to project elected images of unchanged dimension of the plurality of the illuminated regions of the mask, and a mark detection system for detecting a first alignment mark on the mask and for detecting a second alignment mark through at least one of the projection optical systems, and wherein the image of the pattern area is projected onto the substrate by scan-shifting of the mask and the substrate with respect to the projection optical system in the direction substantially perpendicular to the predetermined direction in such a condition that the mask and the photosensitive substrate are positioned on the basis of a detected result from the mark detection system.

DETAILED DESCRIPTION

Figure 1:
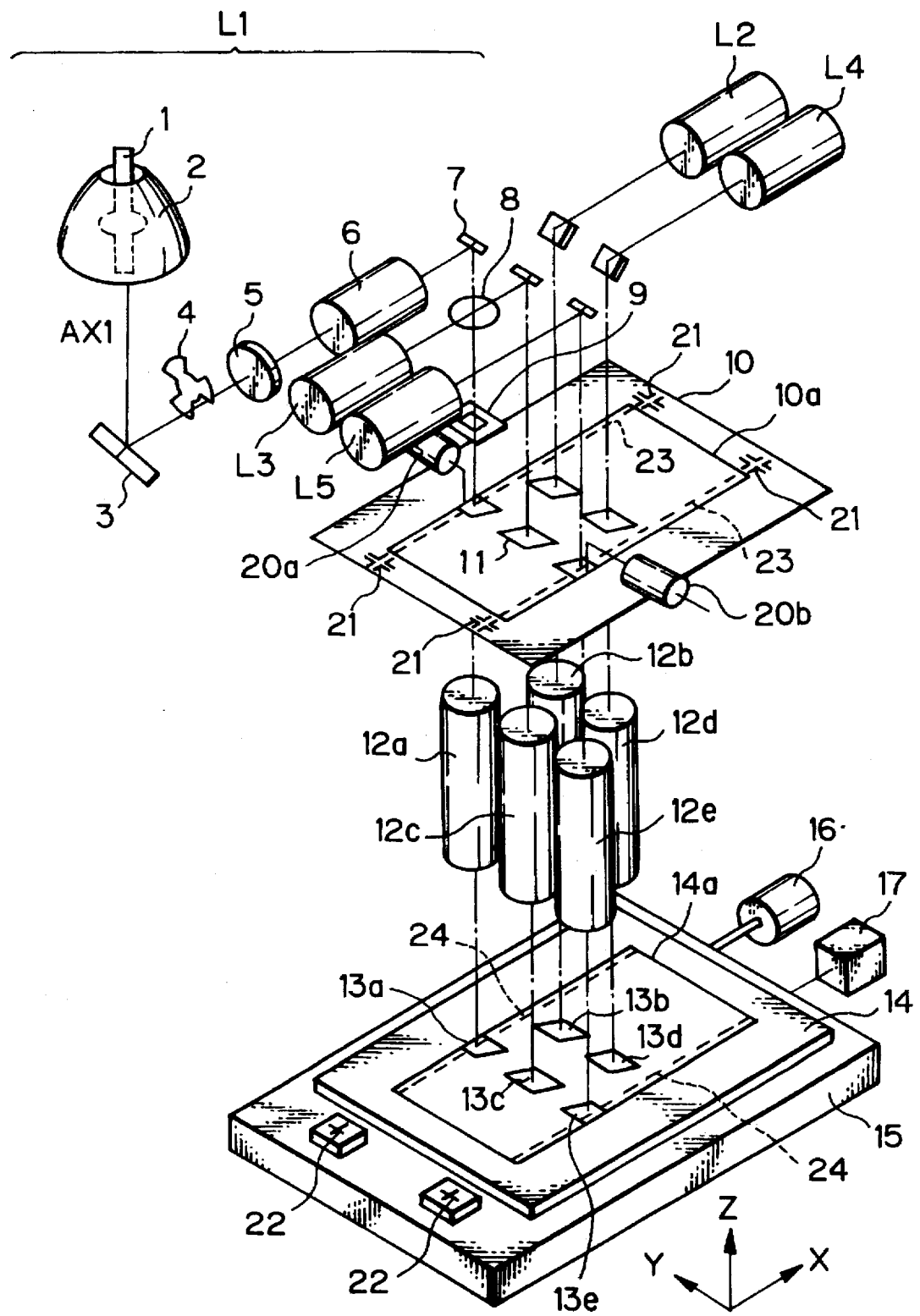
FIG. 1 is a schematic illustration for showing a scanning exposure apparatus according to a preferred embodiment of the present invention.

FIG. 1 schematically shows the construction of a scanning exposure apparatus according to a preferred embodiment of the present invention. A luminous flux emitted from a light source 1 such as a super-high pressure mercury lamp is reflected by an ellipsoidal mirror 2 and then is incident on a dichroic mirror 3. The dichroic mirror 3 serves to reflect the luminous flux component having a wavelength required for executing the exposure and to pass the other luminous flux portion. The supply of the luminous flux reflected by the dichroic mirror 3 to a projection optical system is selectively controlled by a shutter 4 which is movable into and away from the optical axis AX1. When the shutter 4 is opened, the luminous flux is incident on a wavelength selection filter 5, where a luminous flux portion having a wavelength (generally, at least one of g-ray, h-ray and i-ray bands) through which an image can well be transferred by a projection optical system 12a is selected. Since intensity distribution of the luminous flux is so-called Gaussian distribution in which light intensity is strongest in the vicinity of the center of the luminous flux and is gradually decreased toward the periphery of the luminous flux, it is necessary to make the light intensity of the luminous flux uniform at least in a projection area 13a of the projection optical system 12a. To this end, the light intensity of the luminous flux is made uniform by using a fly-eye lens 6 and a condenser lens 8. A mirror 7 is a light deflecting mirror disposed in the light path from the fly-eye lens 6. The luminous flux having the uniform light intensity is then directed to a pattern surface of a mask 10 through a field stop 9. The field stop 9 has an aperture for restricting or regulating the projection area 13a on a photosensitive substrate (referred to merely as "substrate" hereinafter) 14.

Optical elements from the light source 1 to the field stop 9 constitute an illumination optical system L1 for the projection optical system 12a. In the illustrated embodiment, there are provided similar illumination optical systems L2–L5 from which respective luminous fluxes are supplied to corresponding projection optical systems 12b–12e.

The luminous fluxes emitted from the plurality of illumination optical systems L1–L5 are directed to different local areas (illumination areas) 11a–11e (FIG. 2) on the mask 10, respectively. The plurality of luminous fluxes passed through the mask serve to focus pattern images of the illumination areas 11a–11e of the mask 10 on different projection areas 13a–13e on the plate (substrate) 14 through the respective projection optical systems 12a–12e. In this case, each of the images obtained by the projection optical systems 12a–12e is an elected posture (elected real image) of unchanged dimension (no magnification).

Figure 3:
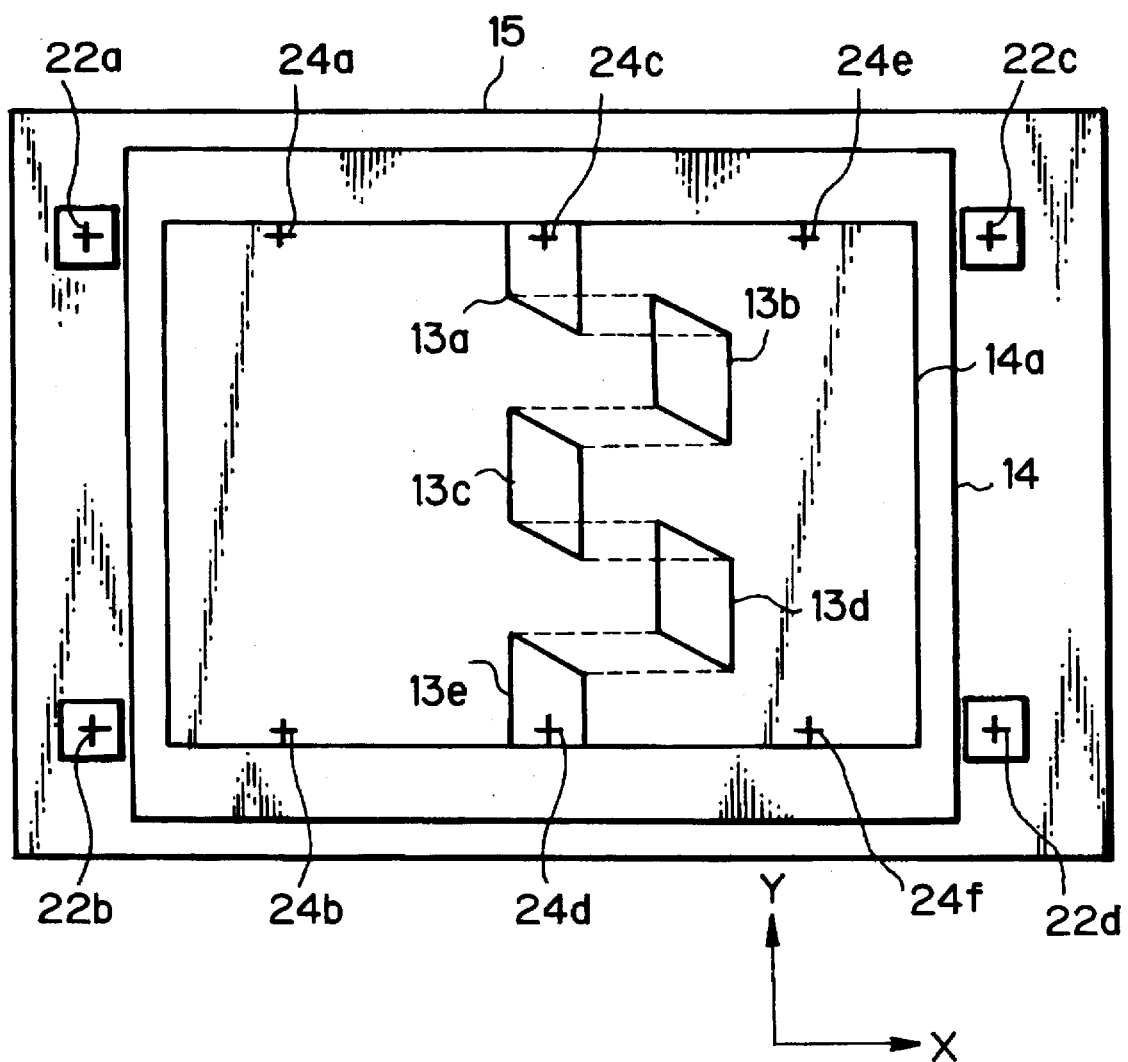
FIG. 3 is a plan view of a substrate stage of the scanning exposure apparatus according to the present invention.

As shown in FIG. 3, the projection areas 13a–13e on the substrate 14 are disposed on the substrate in such a manner that the projection areas adjacent to each other along a Y-direction (for example, projection areas 13a and 13b, projection areas 13b and 13c) are offset from each other by a predetermined amount in an X-direction and the adjacent projection areas are partially overlapped (as shown by the broken lines) with each other in the Y-direction (i.e. adjacent end portions of two projection areas are overlapped in the Y-direction). To this end, the plurality of projection optical systems 12a–12e are similarly positioned in such a manner that they are offset from each other by the predetermined amount in the X-direction and they are partially overlapped with each other in the Y-direction, in correspondence to the positions of the projection areas 13a–13e. Further, the plurality of illumination optical systems L1–L5 are positioned in such a manner that the illumination areas on the mask 10 have the same arrangement as the projection areas 13a–13e. By shifting the mask 10 and the substrate 14 for scanning movement in synchronous with each other in the X-direction with respect to the projection optical systems 12a–12e, the entire pattern area 10a of the mask is transferred onto the exposure area 14a of the substrate.

The substrate 14 is mounted on a substrate stage 15 which includes a driving device 16 having a long stroke in a scanning direction (X-direction) to permit unidirectional scan-exposure. Further, there is provided a position measuring device (such as a laser interferometer) 17 having high resolving power and high accuracy for detecting the position of the substrate state 15 in the scanning direction. The mask 10 is supported by a mask stage (not shown) which includes a driving device and a position measuring device detecting the position of the mask stage in the scanning direction, as is the case in the substrate stage 15. Reference marks 22 are provided at predetermined positions on the substrate stage 15 in a plane, which is substantially flush with the upper surface (on which the mask pattern is projected) of the substrate 14. FIG. 3 is a plan view of the substrate stage. As apparent from FIG. 3, the reference marks 22 are fixed at the predetermined positions (on the substrate stage 15) out of the area on which the substrate 14 is mounted.

Figure 2:
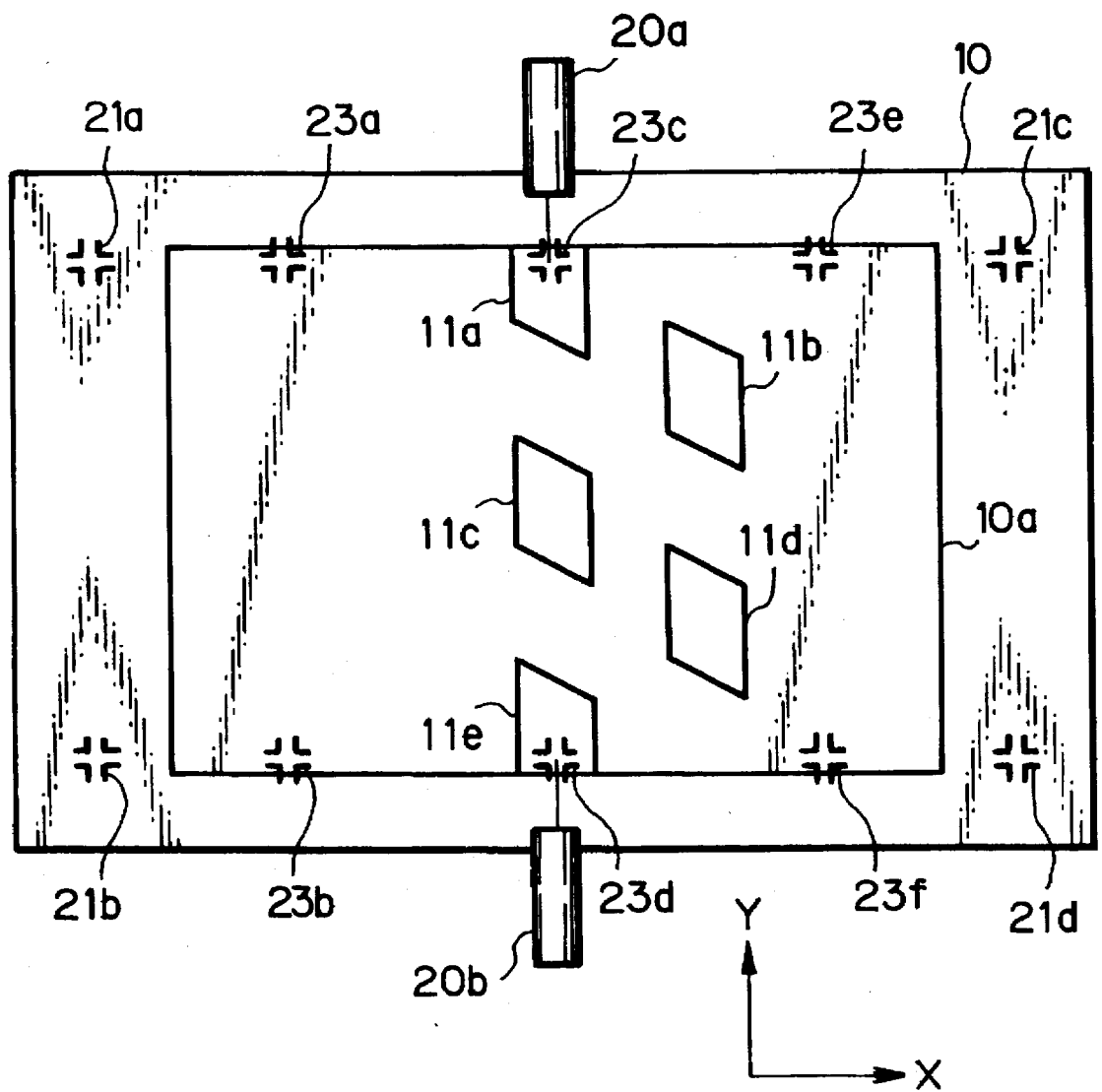
FIG. 2 is a plan view of a mask used with the scanning exposure apparatus according to the present invention.

FIG. 2 is a plan view of the mask 10. The mask 10 has the pattern area (which is illuminated by the illumination optical systems and on which the patterns are formed) 10a corresponding to the area to be transferred to the substrate 14. The mask 10 also has alignment marks 21 (21a–21d) disposed out of the transfer area 10a and alignment marks 23 (23a–23f) disposed within the transfer area 10a.

Figure 4:
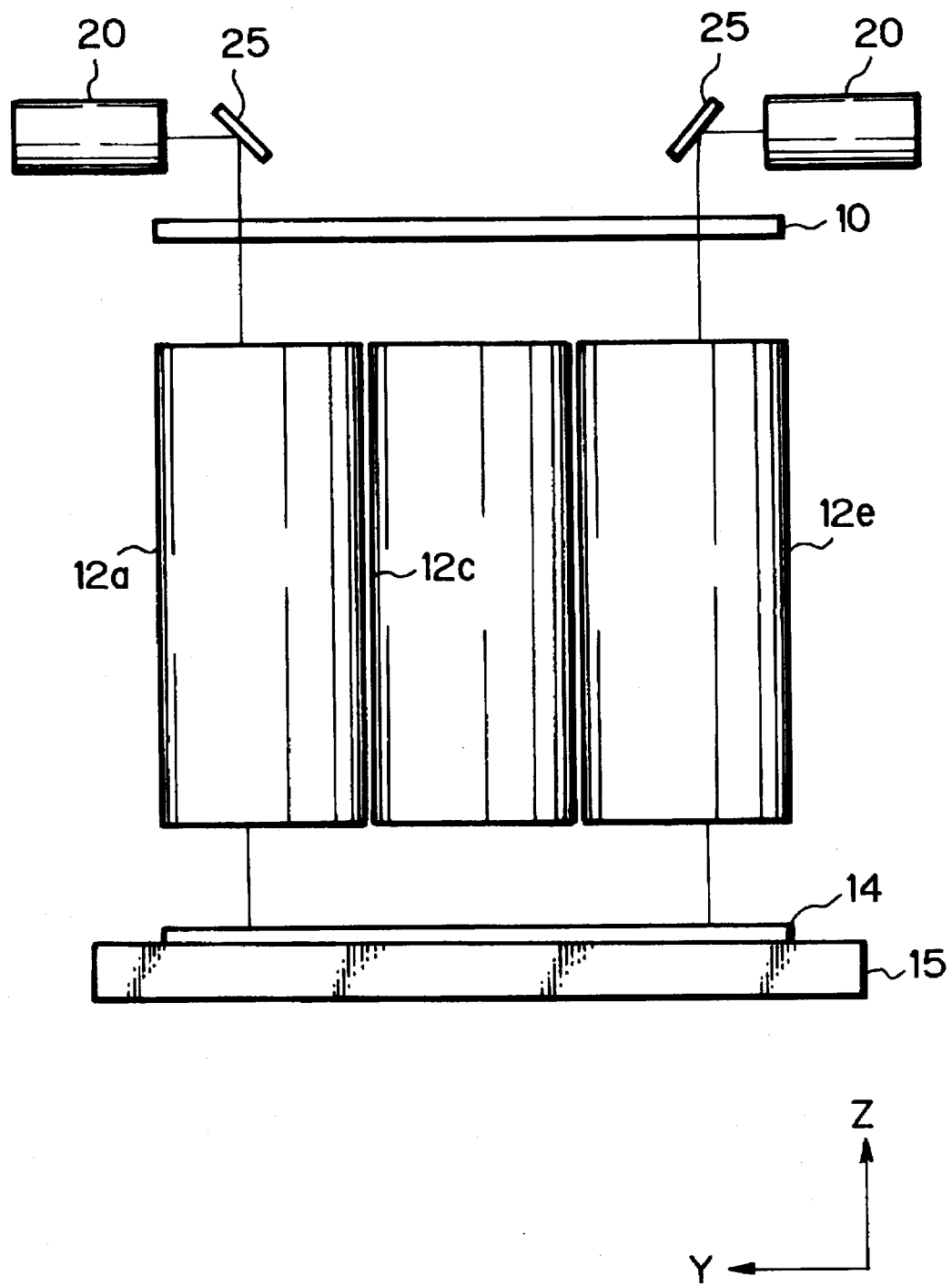
FIG. 4 is a schematic illustration for showing an arrangement of alignment detection systems of the scanning exposure apparatus according to the present invention.

As shown in FIGS. 1 and 4, alignment detection systems 20 are disposed above the mask so that the alignment marks 21, 23 on the mask can be detected by the alignment detection systems and the reference marks (acting also as alignment marks) 22 and alignment marks 24 formed on the substrate 14 can be detected by the alignment detection systems through the projection optical systems 12a, 12e. That is to say, light beams emitted from the alignment detection systems 20 are directed onto the mask 10 through reflection mirrors 25 and then are directed onto the substrate 14 through the endmost optical systems 12a, 12e (among the plurality of projection optical systems). The reflected light beams from the substrate 14 are incident to the respective alignment detection systems 20 through the projection optical systems 12a, 12e and the reflection mirrors 25, and the reflected light beams from the mask 10 are incident to the respective alignment detection systems 20 through the reflection mirrors 25. The alignment detection systems 20 serve to detect the positions of the alignment marks on the basis of the reflected light beams from the mask 10 and the substrate 14.

Next, an alignment operation relying on overlapping between the images on the pattern area of the mask and the images having been formed by exposure on the substrate (positioning operation for positioning the mask and the substrate) according to the present invention will be explained. In FIG. 1, the mask 10 is conveyed onto the mask stage by means of a mask loader (not shown) and is fixed to the mask stage by suction. The alignment detection systems 20 are disposed on column structures (not shown) on which the illumination optical systems L1–L5 and the projection optical systems 12a–12e are mounted. The alignment marks 21 or 23 on the mask are detected by the alignment detection systems 20, and, on the basis of the detected results of the alignment detection systems, by shifting the mask stage in X and Y directions and rotating the mask stage around a Z-axis (angular direction θ), the mask is located at the predetermined position. In this case, for example, by detecting the alignment marks 23c, 23d (FIG. 2) in the transfer area 10a of the mask, positional information of the mask (shift in the X and Y direction and rotation in the angular direction θ) can be obtained. For example, each alignment detection system 20 includes a microscope optical system and an ITV camera or a CCD camera and is so designed that, by taking an image, by the camera, of a region including a desired alignment mark and then by effecting image-treatment, the position of the alignment mark is determined.

Figure 5:
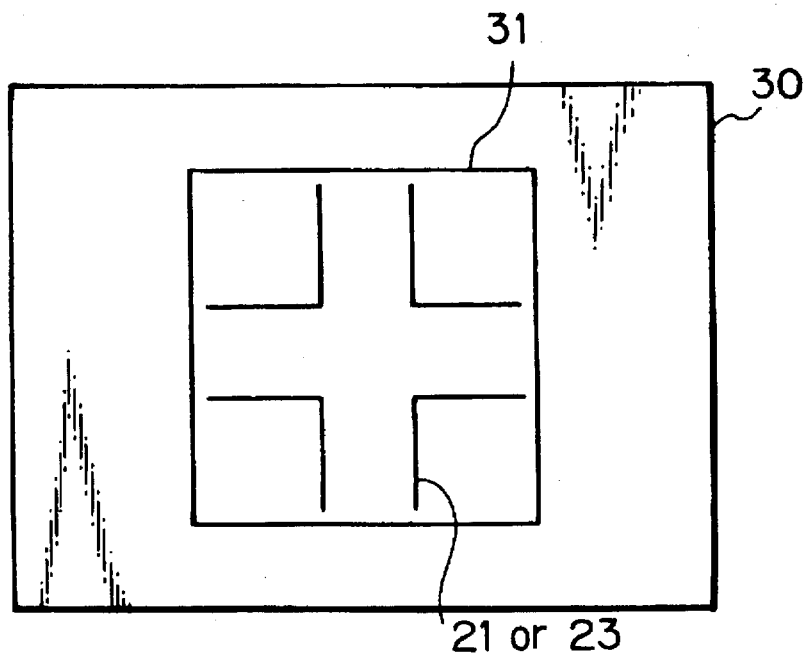
FIG. 5 is a plan view showing an image taken by camera means of the alignment detection system.

FIG. 5 is a view showing the image of the alignment mark 21 or 23 taken or imaged by a camera function of the alignment detection system 20. The reference numeral 30 denotes an image-taking region; and 31 denotes an index mark provided in the alignment detection system. By determining the position of the alignment mark 21 or 23 with respect to the index mark 31, the position of the mask is detected and controlled.

In case of a large mask, since the image-drawing accuracy of the pattern (deviation between the position of a drawn image and a designed position) cannot be made high to the same extent as a small mask and since the large mask is flexed or deformed due to its own weight when the mask is supported, it is desired to improve the positioning accuracy by performing the alignment using a plurality of alignment marks on the mask. To this end, as shown in FIG. 2, the alignment marks 21a and 21b, alignment marks 23a and 23b, alignment marks 23c and 23d, alignment marks 23e and 23f, and alignment marks 21c and 21d are successively detected, and, by treating the detected results in a statistical manner, the position of the mask is controlled. Further, in order to ensure the stability of the alignment detection systems and to align the patterns on the substrate 14 with high accuracy (i.e. to align the mask pattern with the substrate pattern with high accuracy), the reference marks 22 on the substrate stage 15 are detected by the alignment detection systems 20 through the projection optical systems 12a, 12e.

Figure 6:
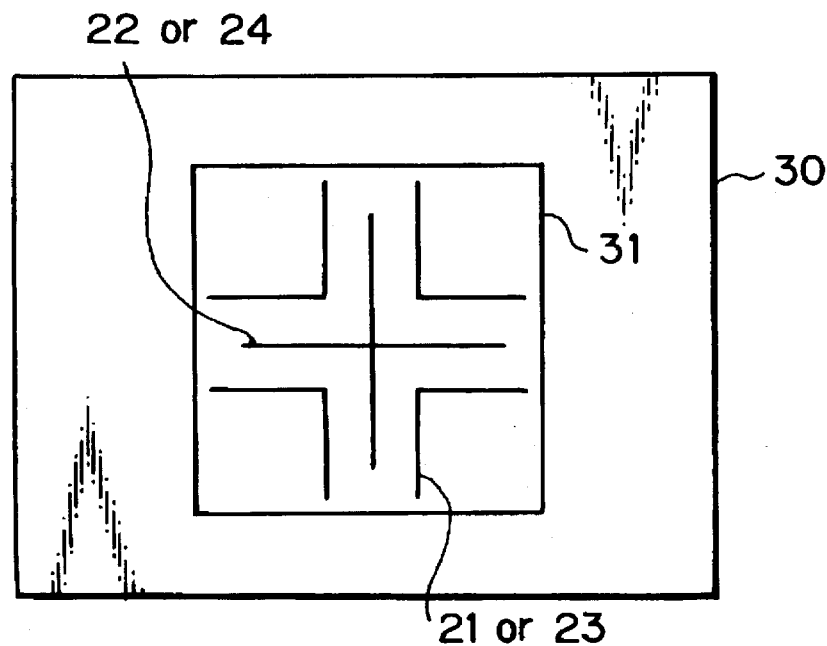
FIG. 6 is a plan view showing an image of a reference mark taken by camera means of the alignment detection system.

FIG. 6 is a view showing an image taken by the camera portion of the alignment detection system 20. By adjusting the index mark 31 with respect to the reference mark 22, it is possible to effect calibration of the alignment detection systems with respect to the positional reference of the substrate stage (i.e. it is possible to locate the index mark 31 as the detection reference of each alignment detection system at a fixed position with respect to the positional reference of the substrate stage). Further, by simultaneously detecting the reference mark 22 on the substrate stage and the alignment mark 21 or 23 on the mask by means of the alignment detection systems 20, it is possible to accurately determine a relation between positional coordinates of the substrate stage and positional coordinates of the mask stage. Therefore, a positional relation between the elements of the exposure apparatus can be maintained stably for a long time. In this case, since each alignment detection system of the exposure apparatus according to the illustrated embodiment has the index mark 31, it is also possible to effect the mask alignment, calibration and determination of correspondence between the coordinates simultaneously.

In FIG. 6, when the calibration of the alignment detection systems 20 is performed, it is not necessary to detect the alignment mark 21 or 23 of the mask.

In operation, a substrate 14 on which alignment marks are formed in a previous process is set on the substrate stage 15 by a substrate conveying system (not shown). In order to align the substrate 14 with the mask 10, the alignment marks 24 on the substrate and the alignment marks 23 disposed within the transfer area 10a of the mask are detected by the alignment detection systems 20 through the projection optical systems 12. Then, the substrate stage 15 is controlled by the driving system (not shown) in the X, Y and θ directions to bring about a predetermined relation between the alignment marks 24 and 23. Considering the deformation of the substrate 14 caused in various processes, it is desirable that the plurality of alignment marks 24a–24f on the substrate 14 shown in FIG. 3 are detected simultaneously with the corresponding alignment marks 23a–23f on the mask shown in FIG. 2 through the projection optical systems 12 in order to achieve the high accurate alignment. The transfer range of each projection optical system 12 in the X-direction is smaller than the extent of the transfer area of the substrate 14 in the same direction. Thus, in order to detect the alignment marks spaced apart from each other in the X-direction (for example, alignment marks 24a and 24c), these alignment marks can be detected successively while driving the mask 10 and the substrate 14 by means of a scanning mechanism 16 of the exposure apparatus.

In case where the projection optical systems 12 are designed so that transferring ability (focusing ability) is made optimum only with respect to a photosensitive wavelength of the substrate 14, the detection light for the alignment (detection of the alignment mark) also has the photosensitive wavelength so that the luminous fluxes from the illumination optical systems L1–L5 can be used for performing the alignment by using half mirrors for the reflection mirrors 25 in FIG. 4. Alternatively, light sources may be provided in the alignment detection systems 20 so that luminous flux having the photosensitive wavelength from each light source of the detection system is directed to the mask 10 or the substrate 14 to detect the alignment mark. When the luminous flux having the photosensitive wavelength is used for detecting the alignment mark, it is apprehended that a zone surrounding the alignment mark of the substrate 14 is exposed to damage the alignment mark. In such a case, it is desirable to design the projection optical systems 12 so that the transferring ability is made optimum not only with respect to the photosensitive wavelength but also non-photosensitive wavelengths, and a luminous flux having a non-photosensitive wavelength is used for effecting the alignment. Further, dichroic mirrors may be used as the reflection mirrors 25 to permit passage of the luminous fluxes having the photosensitive wavelength from the illumination optical systems and to reflect the luminous fluxes having the non-photosensitive wavelength from the alignment detection systems 20. In this case, if the reflection mirrors 25 bring about a bad influence upon the actual transferring/exposure, the reflection mirrors 25, or, both of the reflection mirrors 25 and the alignment detection systems 20 may be adapted to retreat out of the transfer range during the actual transferring/exposure.

The alignment operation may be performed by controlling the substrate 14 (or substrate stage 15) with respect to the mask or by controlling the mask 10 (or mask stage) with respect to the substrate 14. The detection of the alignment marks may be performed prior to the transfer of the mask pattern to the substrate 14 so that the positioning of the mask 10 and the substrate 14 (alignment between the mask 10 and the substrate 14) may be performed before the transfer, or the detection of the alignment marks may be performed while effecting the transfer (scanning exposure) of the mask pattern so that the mask 10 and the substrate 14 may be controlled successively on the basis of the detected results during exposure.

It is not desirable that the alignment marks are located at a central portion of the transfer area on the substrate 14. In general, it is advantageous that the alignment marks 24a–24f on the substrate 14 are disposed along edges of the substrate to effectively form an electronic device on the substrate 14. In the exposure apparatus according to the present invention, since endmost (outermost in the Y-direction) projection optical systems 12a, 12e (among the projection optical systems) are used for detecting the alignment marks, the alignment marks disposed along the edges of the substrate 14 can be detected effectively.

The alignment detection systems 20 may be designed so that the position of an alignment mark is detected by directing a laser beam onto the alignment mark and by photoelectrically detecting the reflected light (diffraction light) from the alignment mark.

As mentioned above, according to the present invention, since the plurality of projection optical systems are disposed along the predetermined direction and an alignment mark on the photosensitive substrate is detected by the alignment detection system through at least one of the plurality of projection optical systems, a corresponding alignment mark on the mask and the alignment mark on the photosensitive substrate can be detected simultaneously, with the result that the mark detection system can be simplified and the scanning exposure can be performed in the condition that the mask and the photosensitive substrate are always aligned with each other, thereby improving the alignment accuracy between the mask pattern and the substrate pattern.

What is claimed is:

1. A scanning exposure apparatus for projecting an image of a pattern area of a mask having a first alignment mark onto a photosensitive substrate disposed on a substrate stage wherein a second alignment mark is provided on at least one of said photosensitive substrate and said substrate stage, said scanning exposure apparatus comprising:

a plurality of illumination optical systems for directing luminous fluxes from light sources to a plurality of regions in the pattern area of said mask, respectively;

a plurality of projection optical systems disposed along a predetermined direction and adapted to receive the luminous fluxes passed through said mask and to project elected images of unchanged dimension of said regions of said illuminated mask onto said substrate; and a mark detection system which detects said first alignment mark on said mask and also said second alignment mark through endmost ones of said projection optical systems with respect to said predetermined direction;

wherein, the image of said pattern area is projected on said substrate to expose it by effecting scan-shifting of said mask and said substrate with respect to said projection optical systems in a scanning direction substantially perpendicular to said predetermined direction in such a condition that said mask and said photosensitive substrate are positioned on the basis of a detected result from said mark detection system.

2. A scanning exposure apparatus according to claim 1, wherein said stage can be shifted in said scanning direction, and said second alignment mark is fixed with respect to said stage.

3. A scanning exposure apparatus according to claim 1, wherein said second alignment mark is provided on said photosensitive substrate.

4. A scanning exposure apparatus according to claim 1, wherein said mark detection system detects said second alignment mark by using a luminous flux which is not active to said photosensitive substrate.

5. A scanning exposure apparatus according to claim 1, wherein said mark detection system includes a reflection mirror disposed in an optical path of said at least one optical system and inclined with respect to said optical path, and an alignment detection system for receiving a luminous flux from said reflection mirror.

6. A scanning exposure apparatus according to claim 5, wherein said alignment detection system includes a light source for alignment and is adapted so that a luminous flux from said light source is reflected by said reflection mirror to illuminate said first and second alignment marks and the luminous fluxes reflected from said first and second alignment marks are returned to said alignment detection system.

7. A scanning exposure apparatus according to claim 5, wherein said reflection mirror comprises a half mirror so that the luminous flux for illuminating the pattern area of said mask is directed to said first and second alignment marks through said half mirror and the luminous fluxes reflected from said first and second alignment marks are directed to said alignment detection system.

8. A scanning exposure apparatus for transferring an image of a pattern of a mask which also has a plurality of first alignment marks onto a photosensitive substrate while synchronously moving the mask and the substrate in a first direction, said apparatus comprising:

a mask stage for supporting said mask and for moving said mask, said mask stage supporting said mask so that said plurality of first alignment marks are disposed along said first direction;

a plurality of projection optical systems disposed along a second direction which is substantially perpendicular to said first direction and adapted to receive luminous fluxes passed through said mask and to project elected images of unchanged dimension of corresponding regions of said mask onto said substrate;

a substrate stage for supporting said substrate and for moving said substrate;

a plurality of second alignment marks provided in a plane which is substantially flush with the top surface of said substrate so that said plurality of second alignment marks are disposed along said first direction;

a mark detection system which detects said first and second alignment marks substantially simultaneously by using a projection optical system positioned to detect said second alignment marks; and an adjusting system for adjusting the relative position between said mask and said substrate on the basis of a detected result from said mark detection system.

9. A scanning exposure apparatus according to claim 8, wherein said mark detection system detects said first and second alignment marks while said mask and said substrate are being moved.

10. A scanning exposure apparatus according to claim 8, wherein said second alignment marks are substrate alignment marks formed on said substrate along an end portion of the substrate.

11. A scanning exposure apparatus according to claim 8, wherein said second alignment marks are reference marks formed on said substrate stage.

12. A scanning exposure apparatus according to claim 8, wherein endmost ones of said projection optical systems with respect to said second direction are optical systems positioned to detect said second alignment marks.

13. A scanning exposure method for transferring an image of a pattern of a mask which also has a plurality of first alignment marks onto a photosensitive substrate while synchronously moving the mask and the substrate in a first direction, said method comprising the steps of:

disposing said first alignment marks along said first direction;

providing a plurality of second alignment marks in a plane which is substantially flush with the top surface of said substrate so that said plurality of second alignment marks are disposed along said first direction;

providing a plurality of projection optical systems disposed along a second direction which is substantially perpendicular to said first direction and adapted to receive luminous fluxes passed through said mask and to project elected images of unchanged dimension of corresponding regions of said mask onto said substrate;

detecting said first and second alignment marks substantially simultaneously by using a projection optical system positioned to detect said second alignment marks; and adjusting the relative position between said mask and said substrate on the basis of a detected result of said mark detection step.

14. A scanning exposure method according to claim 13, wherein said step of detecting said first and second alignment marks substantially simultaneously is achieved while said mask and said substrate are being moved.

15. A scanning exposure method according to claim 13, wherein said second alignment marks are formed on said substrate along an end portion of the substrate.

16. A scanning exposure method according to claim 13, wherein said photosensitive substrate is supported on a substrate stage and said second alignment marks are formed on said substrate stage.

17. A scanning exposure method according to claim 13, wherein endmost ones of said projection optical systems with respect to said second direction are optical systems positioned to detect said second alignment marks.

* * * * *